US008786315B2

(12) United States Patent
Nesreen et al.

(10) Patent No.: US 8,786,315 B2
(45) Date of Patent: Jul. 22, 2014

(54) PHASE FREQUENCY DETECTOR

(75) Inventors: Mahmoud Hammamm Ismail Nesreen, Kuala Lumpur (MY); Shahiman Mohd. Sulaiman Mohd, Kuala Lumpur (MY)

(73) Assignee: Mimos Berhad, Kuala Lumpur (MY)

( * ) Notice: Subject to any disclaimer, the term of this patent is extended or adjusted under 35 U.S.C. 154(b) by 11 days.

(21) Appl. No.: 13/130,518

(22) PCT Filed: Nov. 16, 2009

(86) PCT No.: PCT/MY2009/000193
§ 371 (c)(1),
(2), (4) Date: May 20, 2011

(87) PCT Pub. No.: WO2010/059032
PCT Pub. Date: May 27, 2010

(65) Prior Publication Data
US 2011/0221476 A1    Sep. 15, 2011

(30) Foreign Application Priority Data
Nov. 21, 2008    (MY) .................................. PI20084711

(51) Int. Cl.
*H03D 13/00* (2006.01)
*G01R 25/00* (2006.01)
*H03L 7/089* (2006.01)

(52) U.S. Cl.
CPC ............... *H03L 7/089* (2013.01); *H03D 13/008* (2013.01); *H03L 7/0891* (2013.01)
USPC ............. 327/5; 327/3; 327/7; 327/10; 331/25

(58) Field of Classification Search
CPC ..... H03D 13/003; H03D 13/004; H03K 5/26; H03L 7/085; H03L 7/089; H03L 7/0891; H03L 7/091; G01R 25/00
USPC ......... 327/2, 3, 5, 7–10, 12, 147, 156; 331/25
See application file for complete search history.

(56) References Cited

U.S. PATENT DOCUMENTS

| 5,546,052 A | 8/1996 | Austin et al. |
| 5,592,109 A * | 1/1997 | Notani et al. ...................... 327/3 |
| 5,661,419 A * | 8/1997 | Bhagwan .......................... 327/8 |
| 5,815,041 A * | 9/1998 | Lee et al. .......................... 331/8 |
| 6,771,096 B1 | 8/2004 | Meyers et al. |
| 7,839,177 B1 * | 11/2010 | Soh .................................. 327/3 |

FOREIGN PATENT DOCUMENTS

| KR | 100510523 B1 | 8/2005 |
| KR | 100579051 B1 | 5/2006 |

* cited by examiner

*Primary Examiner* — Patrick O'Neill
(74) *Attorney, Agent, or Firm* — Linda D. Kennedy; Bill C. Panagos; Butzel Long

(57) ABSTRACT

The present invention relates to a phase frequency detector (PFD) (100) for use as one of the blocks in a phase-locked loop. The PFD of the present invention has zero dead zone, has a simpler structure with a minimum number of transistors and requires a smaller area. The PFD of the present invention does not use any inverter or delay gate as found in the conventional PFD. Instead, the PFD of the present invention utilizes feedback transistors that save power and thus the PFD of the present invention is suitable to be used in low power applications.

15 Claims, 3 Drawing Sheets

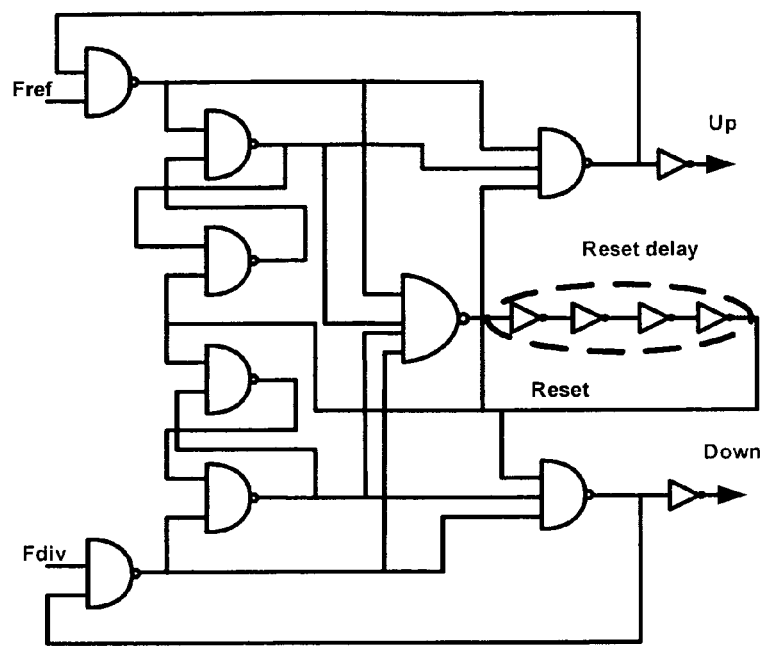
Figure 2 (Prior Art A)
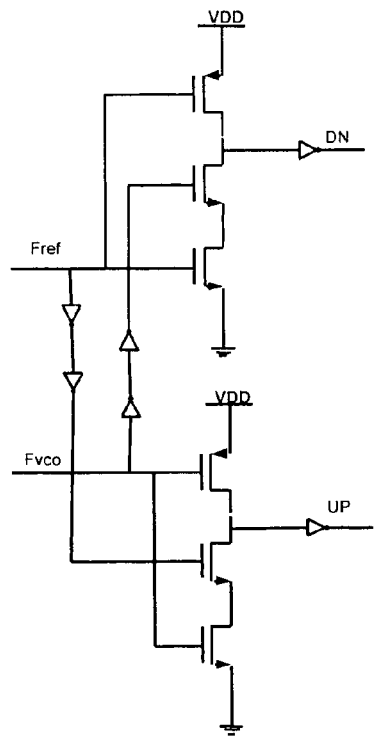
Figure 3 (Prior Art B)

PHASE FREQUENCY DETECTOR

FIELD OF THE INVENTION

The present invention relates to a phase frequency detector for use in a phase-locked loop, particularly it relates to a phase frequency detector with zero dead zone which uses a minimum number of transistors and thus is suitable for low power applications.

BACKGROUND OF THE INVENTION

A phase-locked loop (PLL) is widely used in many electrical and computer applications to maintain a fixed phase relationship between an input signal and a reference signal. In general, a phase locked loop is configured to receive an incoming data signal and analyses that data signal to produce an output clock signal that is synchronized to the incoming data signal.

A phase-locked loop typically comprises four main components: a phase frequency detector, a charge pump, a loop filter, an oscillator (VCO) and a frequency divider.

As illustrated in FIG. 1, a phase frequency detector (12) receives a reference clock signal $CK_{ref}$ and a feedback clock signal $CK_{fbk}$ and detects the phase and frequency difference therebetween to output UP and DN signals, depending on whether the feedback signal is lagging or leading the reference signal in frequency or phase.

A charge pump (14) receives and transforms the phase difference signals UP and DN into a current $I_{cp}$ that controls the oscillation frequency. The current is dependent on the signal output by the phase frequency detector (12). If charge pump (14) receives an UP signal from the detector (12), indicating that the reference clock signal $CK_{ref}$ leads $CK_{fbk}$, the feedback clock signal, and the current $I_{cp}$ is increased. If charge pump (14) receives a DOWN signal from the detector (12), indicating that the reference signal $CK_{ref}$ lags feedback signal $CK_{fbk}$, and the current $I_{cp}$ is decreased. If no UP or DOWN signal is received, indicating that the clock signals are aligned, charge pump (14) does not adjust the current $I_{cp}$.

The current then goes to a loop filter (16) and output a voltage. Filter also removes out-of-band, interfering signals. The voltage is then goes to an oscillator (VCO) (18) to control the frequency of the output clock signal. The VCO output signal may be sent back to the phase frequency detector (12) via a feedback loop (20).

When the reference clock $CK_{ref}$ leads the feedback clock signal $CK_{fbk}$, charge pump (12) increases the current $I_{cp}$ to develop a greater voltage $V_{lf}$ at the output of loop filter (16) which, in turn, causes VCO (18) to increase the output frequency $F_{out}$. Conversely, when the reference clock signal $CK_{ref}$ lags feedback clock signal $CK_{fbk}$, charge pump (14) decreases the current $I_{cp}$ to develop a lesser voltage $V_{lf}$ at the output of loop filter (16) which, in turn, causes VCO (18) to decrease the output frequency $F_{out}$. When the reference clock signal $CK_{ref}$ and feedback clock signal $CK_{fbk}$ are aligned, voltage $V_{lf}$ is not adjusted, and the output frequency $F_{out}$ is kept constant. In this state, PLL is in a "locked" condition.

Phase-locked loops can however suffer from excessive phase jitter at small phase differences. The jitter is caused by a region of low gain, known as the "dead zone". Dead zone is a region near zero phase error in which the edges of the input and reference signals are so close together that the UP and DOWN inputs are not provided with sufficient opportunity to fully switch and thereby drive the charge pump. As a result, the response to a small phase error is less than it should be, i.e. the response is "deadened".

This problem has been dealt with, in the past, by inserting delay means into the reset path. However, the drawback of the delay means is the increased noise in the synthesizer loop.

The basic circuit architecture of a phase frequency detector (PFD) is shown in FIG. 2. This conventional PFD has high power consumption and needs large area for a large number of transistors. In many applications, it is desirable and advantageous to integrate all of the components of a PLL on a semiconductor chip. Therefore, a PFD with a small area is needed.

In order to reduce the power consumption, TSPC D-FF has been used in designing PFD. One of the TSPC PFD topologies is ncPFD as shown in FIG. 3. However, the operation of ncPFD of FIG. 3 may have dead zone. Although delays (2 inverters) are inserted at the $F_{ref}$ and $F_{vco}$ attempting to remove the dead zone, the insertion of the delays or inverters increases the overall power consumption and area.

IEEE symposium on VLSI Circuits Digest of Technical Papers 1994, pp. 129-130, H. Notani et al. discloses a PFD using pre-charged CMOS logic for high frequency operation. It is claimed that the PFD has a minimum detectable phase difference of 40-pico-seconds, and requiting one third the transistors of the conventional circuits. From the diagram as enclosed with the papers, the circuit requires at least 14 transistors. Further, inverters that increase the power consumptions are used in the circuit to reduce dead zone.

SUMMARY OF THE INVENTION

Therefore, there is a need for a phase frequency detector (PFD) which overcomes the afore-mentioned problems including the problems of dead zone and power consumption.

It is an object of the present invention to provide a PFD that has zero dead zone so that any phase differences in the input frequencies will be able to be detected.

Another object of the present invention is to provide a PFD which requires as minimum as 12 transistors only and thus it saves power consumption.

A further object of the present invention is to provide a PFD that has simple topology and requires a smaller area.

It is also an object of the present invention to provide a PFD that utilises a feedback transistor instead of inverters and delay gates that are common in the conventional technologies.

Phase-locked loop (PLL) is a main block in many applications such as communication systems, wireless systems, and sensors receivers. These applications prefer low power consumption blocks to have long life battery. The present invention relates to a PFD for use as one of the PLL blocks and it consumes only a very minimum power.

The PFD of the present invention comprising:

(a). a first signal receiving means (110) including a first input terminal (112) to receive a first input signal and a second input terminal (114) to receive a second input signal;

(b). a second signal receiving means (150) cross-coupled said first input terminal (112) to receive said first input signal and said second input terminal (114) to receive said second input signal;

(c). a first node (136) connected for charging or discharging depending on the signals received at said input terminals (112, 114);

(d). a second node (166) connected for charging or discharging depending on the signals received at said input terminals (112, 114);

(e). a first control logic circuit (140) for receiving a control signal output by said first node (136) and output a first signal to an output terminal (146); and (f). a second control logic circuit (170) for receiving a control signal output by said second node (166) and output a second signal to an output terminal (134);

(g). a first feedback means (130) comprising a first feedback transistor (132) for receiving signals from said output terminal (134) of said second control logic circuit (170);

(h). a second feedback means (160) comprising a second feedback transistor (162) for receiving signals from said output terminal (146) of said first control logic circuit (140).

A method for generating a first output signal and a second output signal corresponding to phase difference or frequency difference between a first input signal and a second input signal comprising the steps of:

(a). receiving at least two input signals, a first input signal and a second input signal;

(b). detecting an edge of said first input signal to generate a first output signal in response to said first input signal; and (c). detecting an edge of said second input signal to generate a second output signal in response to said second input signal wherein the pulse width difference between said first output signal and said second output signal represents the difference of said first and second input signals.

According to the present invention, the falling edge of said second output signal corresponds to the falling edge of said first input signal, whereas, the falling edge of said first output signal corresponds to the falling edge of said second input signal. The first input signal as used herein refers to an external REFERENCE signal, $F_{ref}$ and the second input signal refers to an internal FEEDBACK signal, $F_{vco}$ generated by an oscillator of a phase-locked loop. The first output signal as used herein is refers to a UP signal and the second output signal refers to a DOWN signal.

BRIEF DESCRIPTIONS OF DRAWINGS

For a better understanding, the present invention will now be described with reference to the accompanying drawings in which:

FIG. 2 is a schematic diagram of a phase frequency detector of prior art A.

FIG. 3 is a schematic diagram of a phase frequency detector of prior art B.

DETAILED DESCRIPTIONS OF THE PREFERRED EMBODIMENTS

The present invention now will be described in more detail with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art.

Figure 1:
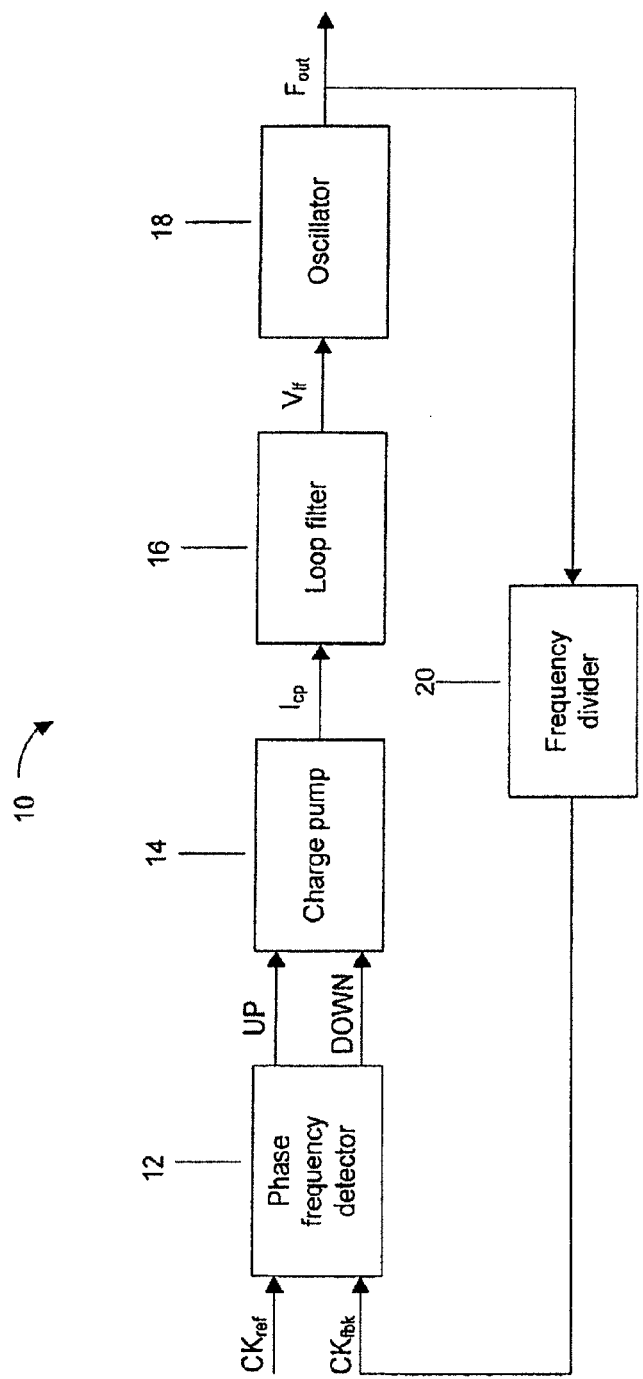
FIG. 1 is a block diagram illustrating a conventional phase-locked loop.
Figure 4:
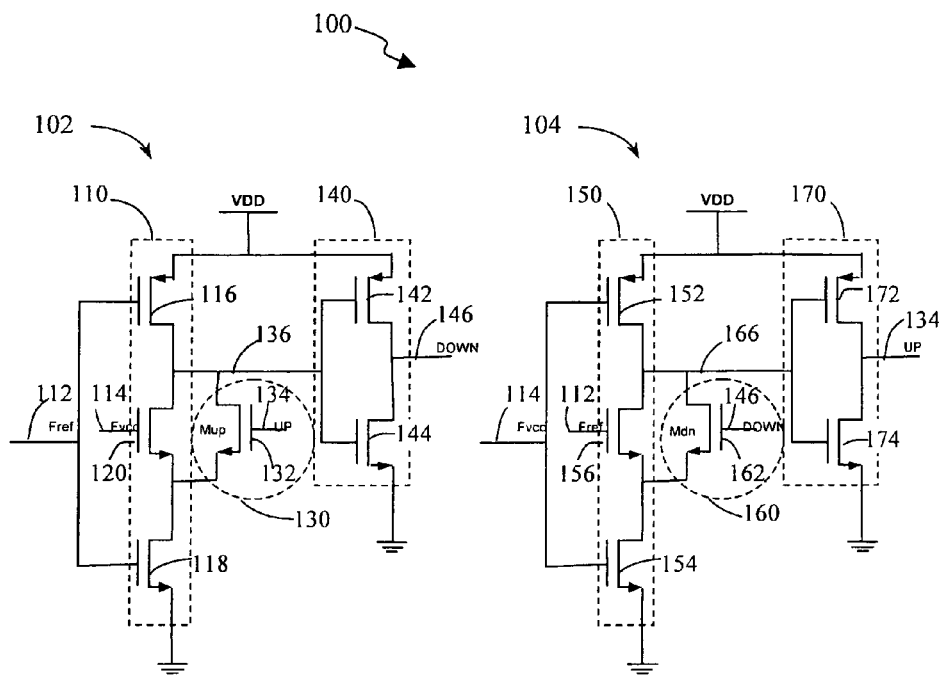
FIG. 4 is a schematic diagram of a phase frequency detector of the present invention.

FIG. 4 is a schematic diagram illustrating a phase frequency detector (PFD) of the present invention. The phase frequency detector is denoted by the numeral 100. The PFD of the present invention comprises a first and a second logic circuit (102, 104) which cross-coupled each other. The first circuit (102) comprises a first signal receiving means (110) which has a first input terminal (112) to receive an external REFERENCE signal, $F_{ref}$ and a second input terminal (114) to receive a FEEDBACK signal from the interior of the phase-locked loop in which the frequency has been divided, $F_{vco}$. The first and second input terminals (112, 114) are connected to a first series connected transistors such that the first input terminal (112) is connected directly to the gate of a first (116) and a third (118) transistors and the second input terminal (114) is connected directly to the gate of a second transistor (120) of the series connected transistors. Preferably, the first transistor (116) is a PMOS transistor whereas the second (120) and the third (118) transistors are NMOS transistors. The series connected transistors have an input from a voltage source connected to the source terminal of said first transistor (116) and an input from ground connected to the drain terminal of said third transistor (118).

As shown in FIG. 4 the series connected transistors are connected to a first node (136). At the joining point of the first and the second transistors, the first node (136) is connected to for charging or discharging depending on the signal received at the input terminal (112). When the signal received at the input terminal (112), i.e. signal $F_{ref}$ is low, the first node (136) is charged through the PMOS transistor (116). The discharging transistors (120, 118) of the series connected transistors operate to discharge the first node (136) when the signal $F_{ref}$ (112) is high or when the UP signal (134) output by the second circuit (104) is high.

The first node (136) is connected to a first control logic circuit (140). The first control logic circuit (140) receives a control signal from the first node (136) and output a signal to its output terminal (146). In the preferred embodiment of the present invention, the first control logic circuit (140) comprises a pair of series connected transistors (142, 144), preferably a PMOS transistor and a NMOS transistor. The pair of transistors is connected at their gates to said node (136, 166) and is connected at their joining point to said output terminal (134, 146). The PMOS transistor (142) has an input from a voltage source and the NMOS transistor (144) has an input from ground.

When the signal $F_{ref}$ (112) is low, the first node (136) is charged through the PMOS transistor (116) and subsequently a high voltage signal is received at the first logic circuit (140). When a high voltage signal is detected, the PMOS transistor (142) of the first logic circuit (140) would have high resistance so it would block voltage source from the output, while the NMOS transistor (144) would have low resistance allowing the output to drain to ground. This would result in the first output terminal (146) a low voltage.

The second circuit (104) comprises a second signal receiving means (150). The signal receiving means (150) has a second series connected transistors cross-coupled the input terminals (112, 114) of the first signal receiving means (110) such that the first input terminal (112) cross-coupled the gate of a second transistor (156) to receive the REFERENCE signal, $F_{ref}$ while the second input terminal (114) cross-coupled the gate of a first (152) and a third (154) transistor of the second series connected transistors to receive the FEEDBACK signal, $F_{vco}$. Preferably, the first transistor (152) of the second series connected transistors is a PMOS transistor whereas the second (156) and the third (154) transistors are NMOS transistors.

The signal output by the second signal receiving means (150) is then goes to a second node (166). At the joining point of the first and the second transistors, the second node (166) is connected to. The second node (166) is charged through the PMOS transistor (152) when the signal $F_{vco}$ is low and is discharged through the discharging transistor (154, 156) when the signal $F_{vco}$ is high or the DOWN signal output by the first circuit (102) is high.

If the signal $F_{vco}$ is low, the second node (166) is charging and a high voltage signal is received at a second control logic circuit (170) which, in turn, output a signal of low voltage.

One of the main features of the present invention is that the PFD uses a feedback transistor instead of inverters and delay gates as found in the conventional technologies. A first and a second feedback transistor (132, 162) for a first and a second feedback means (130, 160) are shown in FIG. 4.

The first and the second feedback transistors (132, 162) are respectively connected to the discharging transistors (118 and 120, 154 and 156) of the series connected transistors, the nodes (136, 166) and cross-coupled the output terminals (146 and 134). The first feedback transistor (132) is controlled by the cross-coupled signal UP and the second feedback transistor (162) is controlled by the cross-coupled signal DOWN.

Another embodiment of the present invention relates a method for generating a first output signal and a second output signal corresponding to phase difference or frequency difference between a first input signal and a second input signal comprising the steps of:

(a). receiving at least two input signals, a first input signal and a second input signal;
(b). detecting an edge of said first input signal to generate a first output signal in response to said first input signal; and
(c). detecting an edge of said second input signal to generate a second output signal in response to said second input signal wherein the pulse width difference between said first output signal and said second output signal represents the difference of the two input signals.

According to this embodiment, the falling edge of said second output signal corresponds to the falling edge of said first input signal, whereas, the falling edge of said first output signal corresponds to the falling edge of said second input signal. The first input signal as used herein refers to an external REFERENCE signal, $F_{ref}$ and the second input signal refers to an internal FEEDBACK signal, $F_{vco}$ generated by an oscillator of a phase-locked loop. The first output signal as used herein refers to a UP signal and the second output signal refers to a DOWN signal.

Figure 5:
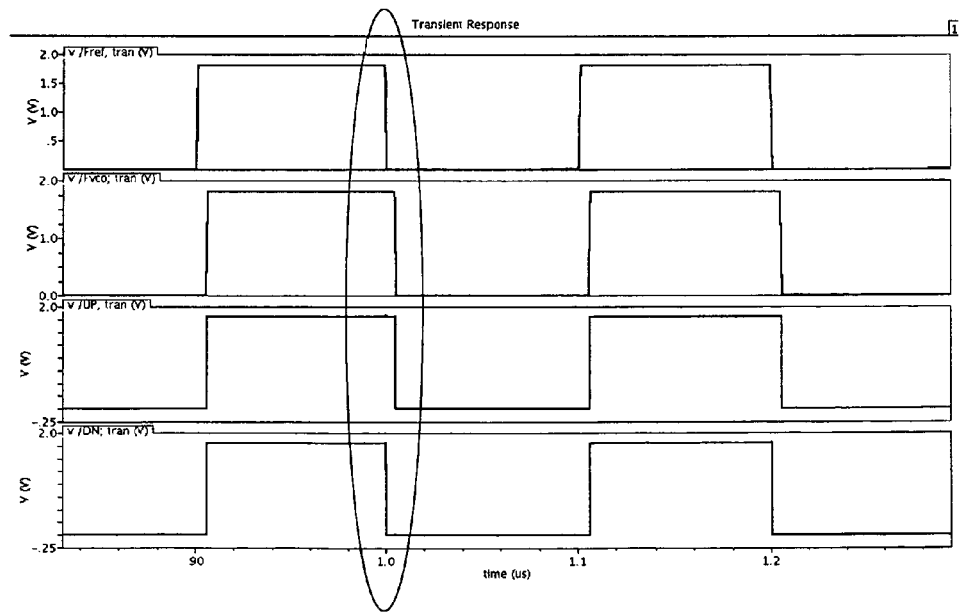
FIG. 5 is a timing diagram of output signals of a phase frequency detector in accordance with the present invention.

Referring now to FIG. 5, at the falling edge of $F_{ref}$, the charging transistor (116) is turned on and starts charging the first node (136). This results in a low DOWN signal at the output (146). The UP signal is following the falling edge of $F_{vco}$, i.e. at the falling edge of $F_{vco}$, the charging transistor (152) is turned on and starts charging the second node (166) resulting in a low UP signal at the output (134). The difference in pulse width between the UP and DOWN signals represents the differences in the input phase. The results are taken from simulations using silterra 0.18 μm CMOS process, sizes of N and P transistors are 2 and 4 μm respectively, VDD=1.8V and tested at frequency=50 MHz. It consumes 15.12 μW of power. The maximum operating frequency is defined as the shortest period with correct UP and DOWN signals when the two frequency inputs have the same frequency and 90° phase shift. The maximum operating frequency for the present PFD at 1.8V is 2 GHz. The phase noise at 1 MHz offset is −68.5 dBc/Hz.

Since the UP and DOWN signals are high at the same time, it requires to have a charge pump with matched current sources. In the case of locking, the UP and DOWN signals will be high, then current source and current sink should be equal to have a net voltage change which is equal to zero.

It is understood that the above description does not limit the invention to the above given details. It will be apparent to those skilled in the art that various changes and modification may be made therein without departing from the principle of the invention or from the scope of the appended claims.

The invention claimed is:

1. A phase frequency detector, comprising:
(a) a first signal receiving means including a first input terminal to receive a first input signal and a second input terminal to receive a second input signal;
(b) a second signal receiving means cross-coupled said first input terminal to receive said first input signal and said second input terminal to receive said second input signal;
(c) a first node connected for charging or discharging depending on the signals received at said input terminals;
(d) a second node connected for charging or discharging depending on the signals received at said input terminals;
(e) a first control logic circuit for receiving a control signal output by said first node and output a first signal to an output terminal; and
(f) a second control logic circuit for receiving a control signal output by said second node and output a second signal to an output terminal;
(g) a first feedback means comprising a first feedback transistor for receiving signals from said output terminal of said second control logic circuit;
(h) a second feedback means comprising a second feedback transistor for receiving signals from said output terminal of said first control logic circuit,
wherein said phase frequency detector comprises no more than 12 transistors.

2. A phase frequency detector according to claim 1 wherein said first signal receiving means comprises a first series connected transistors coupled to both said first and second input terminals such that said first input terminal is connected directly to the gate of a first and a third transistors and said second input terminal is connected directly to the gate of a second transistor of said first series connected transistors and said first series connected transistors has an input from a voltage source connected to the source terminal of said first transistor and an input from ground connected to the source terminal of said third transistor.

3. A phase frequency detector according to claim 2 wherein said first node is connected to said first series connected transistors at the joining point of said first and second transistors, to the drain terminal of said first feedback transistor and to said first control logic circuit.

4. A phase frequency detector according to claim 1 wherein said second signal receiving means comprising a second series connected transistors cross-coupled both said input terminals such that said first input terminal cross-coupled the gate of a second transistor and said second input terminal cross-coupled the gate of a first and a third transistors of said second series connected transistors and said second series connected transistors has an input from a voltage source connected to the source terminal of said first transistor and an input from ground connected to the source terminal of said third transistor.

5. A phase frequency detector according to claim 4 wherein said second node is connected to said second series connected transistors at the joining point of said first and second transistors, to the drain terminal of said second feedback transistor and to said second control logic circuit.

6. A phase frequency detector according to claim 1 wherein said first and second control logic circuits each comprises a pair of transistors connected in series, and said pair of transistors is connected at their gates to said node and is connected at their joining point to said output terminal.

7. A phase frequency detector according to claim 1 wherein said first and second control logic circuits each further comprises at least an input from a voltage source and at least an input from ground.

8. A phase frequency detector according to claim 1 wherein said first signal is an external REFERENCE signal, $F_{ref}$.

9. A phase frequency detector according to claim 1 wherein said second signal is a FEEDBACK signal from the interior of a phase-locked loop in which the frequency has been divided, $F_{vco}$.

10. A phase frequency detector according to claim 1 wherein said first node is charged when said first signal is low and it produces a low output at the output terminal.

11. A phase frequency detector according to claim 1 wherein said second node is charged when said second signal is low and it produces a low output at the output terminal.

12. A method for generating a first output signal and a second output signal corresponding to phase difference or frequency difference between a first input signal and a second input signal, comprising:
    operating a phase frequency detector with feedback transistor and no more than 12 transistors, the phase frequency detector being configured for
    receiving at least two input signals, said first input signal and said second input signal,
    detecting an edge of said first input signal to generate said first output signal in response to said first input signal, and
    detecting an edge of said second input signal to generate said second output signal in response to said second input signal,
    wherein the pulse width difference between said first output signal and said second output signal represents the difference of said first and second input signals.

13. A method for generating a first output signal and a second output signal corresponding to phase difference or frequency difference between a first input signal and a second input signal according to claim 12 wherein said first input signal is an external REFERENCE signal, $F_{ref}$.

14. A method for generating a first output signal and a second output signal corresponding to phase difference or frequency difference between a first input signal and a second input signal according to claim 12 wherein said second input signal is an internal FEEDBACK signal, $F_{vco}$ generated by an oscillator of a phase-locked loop.

15. A method for generating a first output signal and a second output signal corresponding to phase difference or frequency difference between a first input signal and a second input signal according to claim 12 wherein said first output signal is a UP signal and said second output signal is a DOWN signal.

* * * * *